United States Patent
Weiss et al.

(10) Patent No.: US 9,108,317 B2
(45) Date of Patent: Aug. 18, 2015

(54) MANIPULATION APPARATUS WITH PARALLEL MOVEMENT UNITS FOR FASTENING ELEMENT

(75) Inventors: Uwe Weiss, Buchen (DE); Joseph Aleida Mathieu Maria Pinxt, Kerkrade (NL); Thomas Sarbach, St. Niklaus (CH); Thomas Hess, Limbach (DE)

(73) Assignee: WEISS GMBH, Buchen (DE)

( * ) Notice: Subject to any disclaimer, the term of this patent is extended or adjusted under 35 U.S.C. 154(b) by 251 days.

(21) Appl. No.: 13/809,909

(22) PCT Filed: Sep. 30, 2011

(86) PCT No.: PCT/EP2011/004909
§ 371 (c)(1),
(2), (4) Date: Jan. 14, 2013

(87) PCT Pub. No.: WO2012/041520
PCT Pub. Date: Apr. 5, 2012

(65) Prior Publication Data
US 2013/0136571 A1    May 30, 2013

(30) Foreign Application Priority Data
Oct. 1, 2010    (DE) .......................... 10 2010 047 308

(51) Int. Cl.
| B25J 9/16 | (2006.01) |
| B25J 11/00 | (2006.01) |
| H05K 13/04 | (2006.01) |
| B23Q 1/48 | (2006.01) |
| B25J 9/10 | (2006.01) |

(52) U.S. Cl.
CPC . *B25J 11/00* (2013.01); *B23Q 1/48* (2013.01); *B25J 9/106* (2013.01); *H05K 13/04* (2013.01)

(58) Field of Classification Search
CPC .......... B23Q 1/48; B23Q 1/58; B23Q 1/5487; H05K 13/04; B25J 9/106
USPC ...................................................... 414/751.1
See application file for complete search history.

(56) References Cited

U.S. PATENT DOCUMENTS

| 6,328,510 B1 * | 12/2001 | Hanrath et al. .............. 74/490.1 |
| 2003/0051336 A1 | 3/2003 | Helm et al. |
| 2005/0135916 A1 * | 6/2005 | Wakaizumi ................ 414/744.3 |

FOREIGN PATENT DOCUMENTS

| DE | 198 06 085 A1 | 4/1999 |
| DE | 102 06 414 A1 | 10/2002 |
| DE | 10 2004 058437 A1 | 6/2005 |
| NL | 1 019 443 C2 | 6/2003 |

OTHER PUBLICATIONS

International Search Report (in German with English translation) for PCT/EP2011/004909, mailed Dec. 6, 2011; ISA/EP.

* cited by examiner

*Primary Examiner* — Gerald McClain

(57) ABSTRACT

A manipulation device for manipulating and/or processing a workpiece includes a first motion unit for generating a linear motion of a first component and a second motion unit for generating a linear motion of a second component. The motion units are arranged relative to each other such that the motions that can be generated by the motion units are aligned parallel to each other. The first and second components are connected via first and second hinge joints, respectively, to a fastening element that is suitable for receiving a workpiece and/or a tool. The first and second hinge joints comprise first and second guide arms, respectively, which are coupled to the first and second components, respectively, via revolute joints. The first and second guide arms are coupled directly or indirectly to each other by at least one revolute joint so as to be pivotable relative to each other.

28 Claims, 10 Drawing Sheets

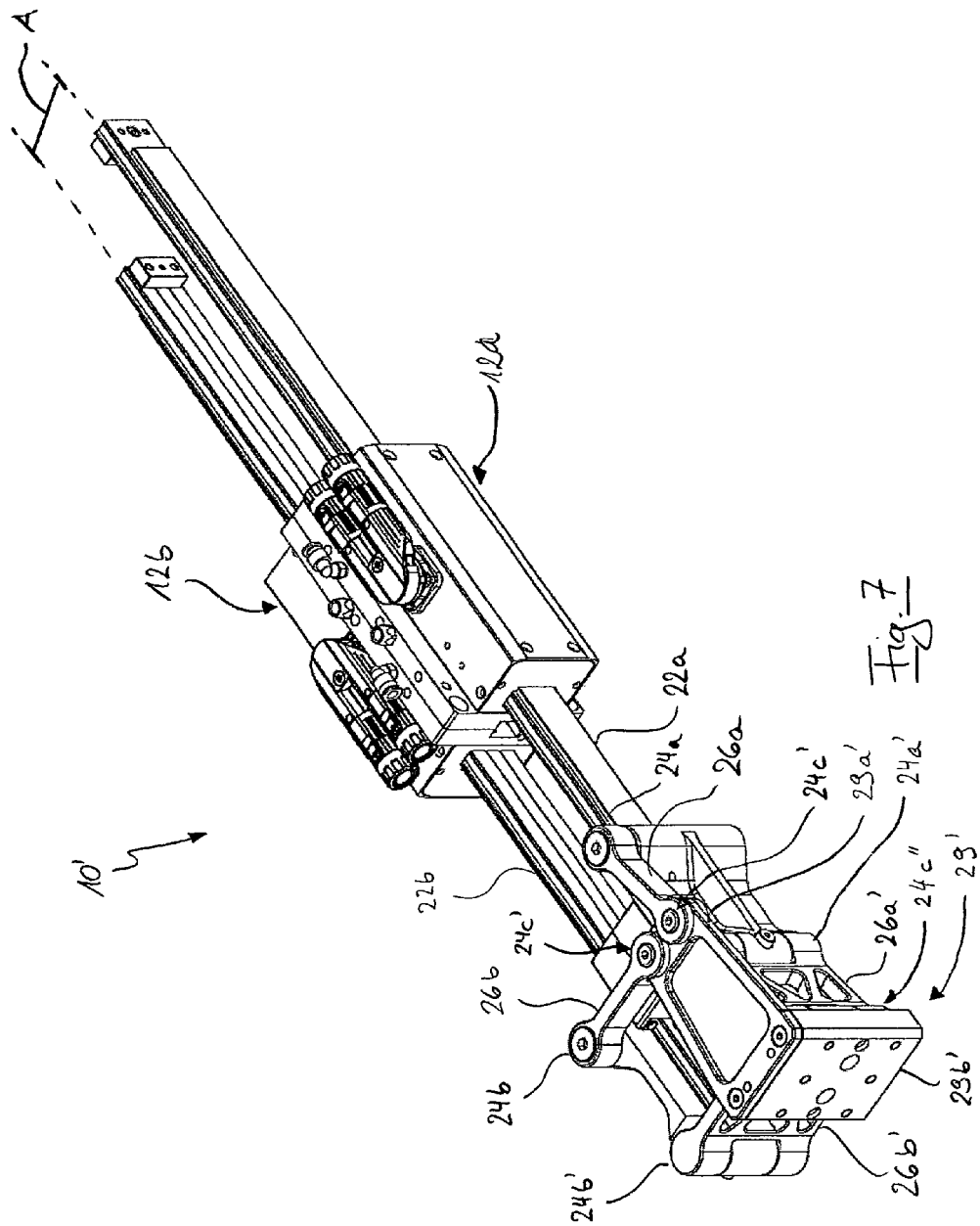

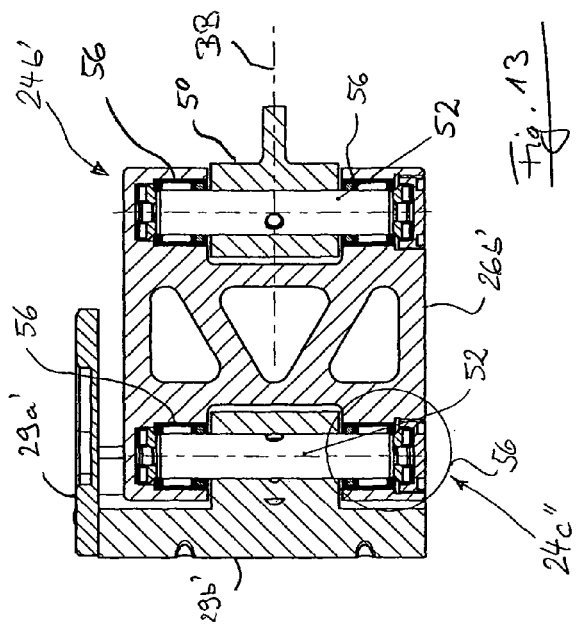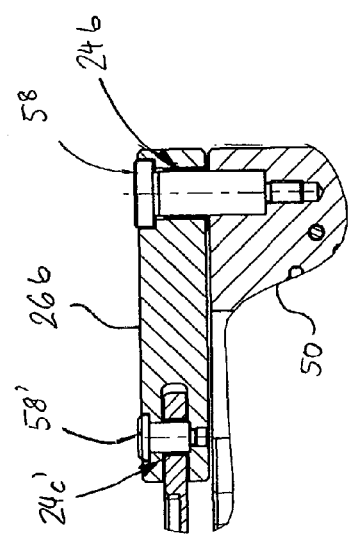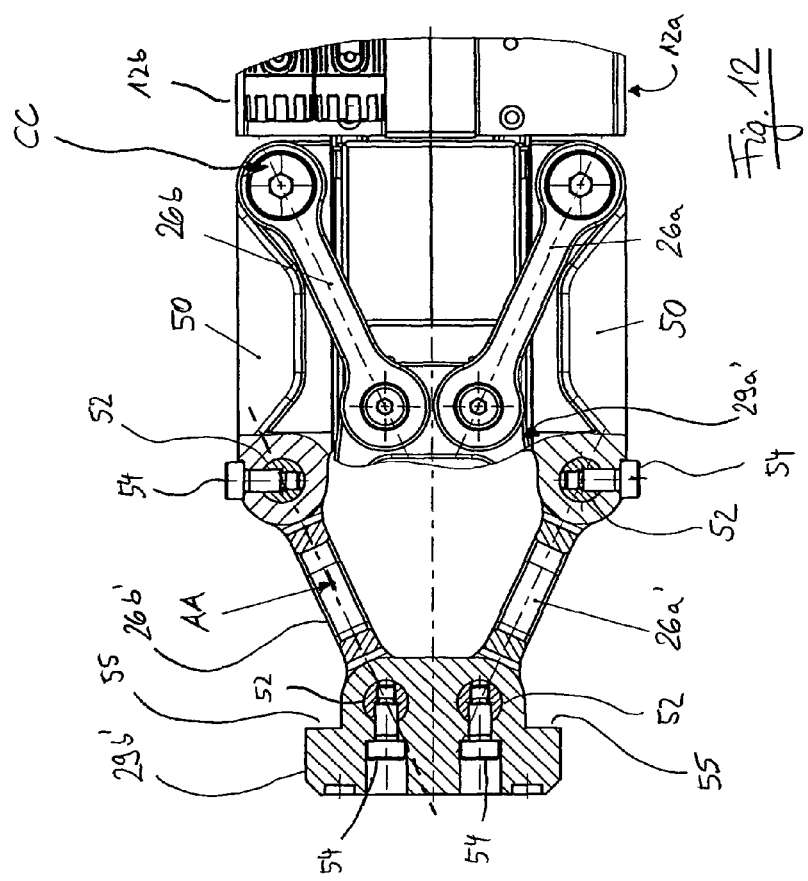

MANIPULATION APPARATUS WITH PARALLEL MOVEMENT UNITS FOR FASTENING ELEMENT

CROSS-REFERENCE TO RELATED APPLICATIONS

Figure 1:
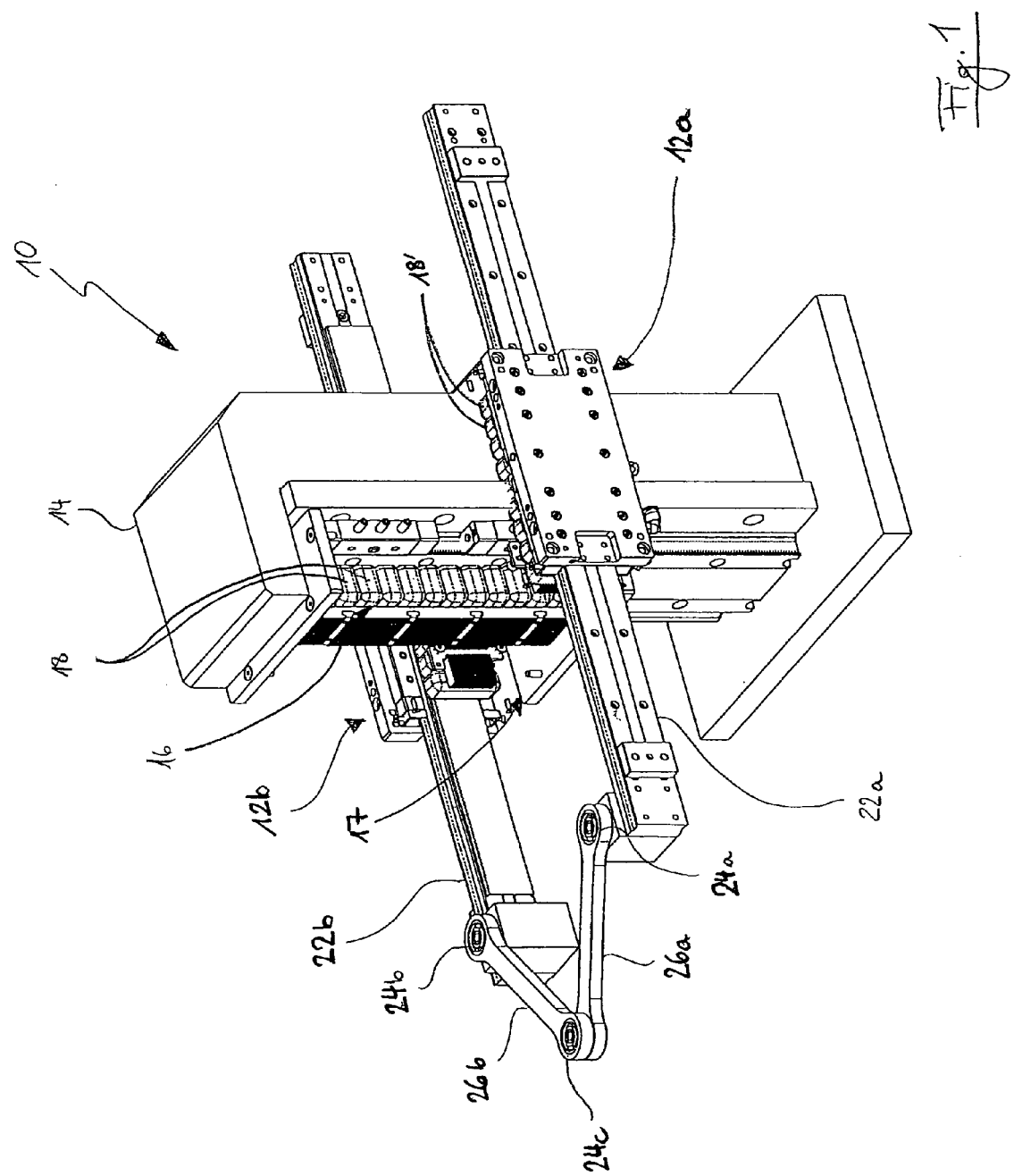

This application is a 371 U.S. National Stage of International Application No. PCT/EP2011/004909, filed on Sep. 30, 2011. This application claims priority to German Application No. 10 2010 047 308.1, filed on Oct. 1, 2010. The contents of the above applications are herein incorporated by reference in their entirety.

The present invention relates to a manipulation apparatus for handling and/or processing a workpiece.

Manipulation apparatus are programmable machines for handling, assembling and/or processing workpieces. They are as a rule used in an industrial environment. Such devices are able to carry out specific work routines reliably and autonomously through a suitable programming. High demands are made on manipulation apparatus with respect to the reliability and the exact reproducibility of the programmed work routines. In addition, such apparatus should be compact and robust. The commercial success of such apparatus, also called industrial robots, in addition substantially depends on the work routines being able to be carried out fast, i.e. the movements generated by the manipulation apparatus should have high dynamics.

It is an object of the present invention to provide a manipulation apparatus of the above-named kind which satisfies the described demands and which is simultaneously also inexpensive in manufacture and maintenance.

This object is satisfied by a manipulation apparatus having the features of claim 1.

In accordance with the invention, the manipulation apparatus for handling and/or processing a workpiece includes a first movement unit for generating a linear movement of a first component and a second movement unit for generating a linear movement of a second component.

The movement units are arranged relative to one another such that the movements which can be generated by the movement units are aligned in parallel with one another. The first and the second components are each connected via a first or second pivotal connection respectively to a fastening element which is suitable for taking up the workpiece and/or a tool. The first pivotal connection includes a first guide arm which is coupled to the first component by means of a pivot joint and the second pivotal connection includes a second guide arm which is coupled to the second component by means of a pivot joint. The first guide arm and the second guide are directly or indirectly coupled to one another in a manner pivotable relative to one another by at least one pivot joint.

In other words, the manipulation apparatus has two components which are each movable along a straight line to generate movements of the fastening element. In order not to generate only one-dimensional translational movements in this respect, but also to allow movements in a plane or pivot movements, the fastening element is connected to the first and second components via corresponding pivotal connections. A positional change of the fastening element can be effected by an individual control of the movement units, which generate movements of the respective component arranged offset in parallel to one another, due to the coupling of the fastening element to the two components provided by the pivotal connections. For example, a synchronous activation of the two movement units in the opposite direction results in a pure translational movement of the fastening element. If, in contrast, the movement units are activated so that movements in the same direction or movements differing in the amount of movement and/or movements of different speeds of the corresponding components can be generated, the resulting movement of the fastening element can, for example, have a pivot component and/or a lateral movement. The manipulation apparatus described above is thus in a position to generate two-dimensional movements of the fastening element with the aid of two components movable in parallel. That is, the fastening element which is provided, for example, with a gripper for taking up a workpiece or a tool for processing a workpiece can be moved in a plane without two linear movement axes or pivot drives arranged perpendicular to one another being required.

A robust design is created by the parallel arrangement of the directions of movement of the two components which allows the manipulation of comparatively large masses—considered with respect to the design of the movement units. Due to the parallel alignment of the components, they mutually support one another in the taking up of the masses to be moved. Conversely, this means that the manipulation apparatus, which is designed for a specific maximum load, has to be made less sturdily than a conventional industrial robot. The linearly movable components of the movement unit can therefore in particular be of a lighter design than corresponding components of known apparatus, which has a positive effect on the movement dynamics. In addition, the manipulation apparatus can be designed as "slimmer" and more compact overall.

Movement apparatus of the same type which allow a symmetrical structure of the manipulation apparatus are preferably used. Furthermore, cost benefits arise in the manufacture and in the maintenance of the manipulation apparatus by the use of the same movement units.

A design of the pivotal connections with guide arms is simple from a construction aspect and allows a reliable guidance of the fastening element by the movement of the two components. Geometrical changes between the two named components can be taken up by the pivot joint between the respective component and the guide arm. The guide arms can generally include a plurality of components which are mutually pivotable—actively and/or passively. Provision is, however, as a rule made that the guide arms are rigid components.

Furthermore, the first guide arm and the second guide arm are coupled to one another. A movement of the components is thus converted via the guide arms into a movement of the fastening element. The resulting movement of the fastening element is therefore defined by the geometrical arrangement of the two components and the design and interplay of the guide arms. The coupling between the two guide arms includes at least one pivot joint which couples the first and second pivotal connections directly or indirectly to one another in a manner pivotable to one another.

In accordance with an embodiment, the first guide arm and the second guide arm are coupled to the fastening element by separate pivot joints. That is, the two guide arms are not in direct contact with one another so that an indirect coupling of the guide arms is realized via the fastening element.

The first pivotal connection can include a third guide arm which is coupled to the first component by means of a pivot joint and the second pivotal connection can include a fourth guide arm which is coupled to the second component by means of a pivot joint. A stable design of the coupling between the fastening element and the first and second components is provided by the additional guide arms, on the one hand. Furthermore, influence can be taken on the movement of the fastening element in response to a movement of the first and/or second components by the design of the third and fourth guide arms.

The fastening element can include a base plate and a work plate, with the first guide arm and the second guide arm being coupled to the base plate by separate pivotal joints and the third guide arm and the fourth guide arm are coupled to the work plate by separate pivot joints. For example, the pivot joints of the first and third guide arms at the fastening element side lie on one line which is arranged parallel to the directions of movement of the components. The same can apply analogously to the pivot joints of the second and fourth guide arms at the fastening element side. It is also possible to position the pivot joints of the guide arms at the component side correspondingly.

The base plate and the working plate can be fixedly connected to one another to form a rigid fastening element to which the guide arms are pivotably fastened.

It is advantageous in many cases if the first guide arm and the third arm are of equal length and if the second guide arm and the fourth guide arm are of equal length. Provision can also be made that all the guide arms are of equal length. The guide arms form a parallelogram which is defined by the lengths of the guide arms and the spacings of the pivot joints at the component side. A relative movement of the components results in a distortion of the parallelogram, with an alignment of the fastening element remaining unchanged, however. Only the position of the fastening element within a plane spanned by the components is changed.

In accordance with a further embodiment, the first guide arm and the second guide arm are coupled to one another in a manner pivotable relative to one another by a common pivot joint. In other words, the first and second guide arms are, in contrast to the above-described embodiment, in direct contact with one another via the pivot joint. This structure is simple in construction and allows high movement dynamics due to the comparatively small moved masses.

To increase the flexibility of the manipulation apparatus, the fastening element is arranged—actively or passively—rotatable relative to the pivotal connections or to the guide arms. The fastening element is preferably in each case rotatably coupled—directly or indirectly—to the guide arms, in particular in the region of the pivot joint connecting the guide arms or by the pivot joint itself.

A rotational device with which an alignment of the fastening element relative to at least one of the guide arms can be changed can be associated with the fastening element. For example, a pivot drive can be provided which is controllable by a control device and which changes an alignment of the fastening element and thus of the workpiece and/or tool arranged thereat as required. It is also possible to associate a rotational device with the fastening element, said rotational device being designed such that an alignment of the fastening element relative to the directions of movement of the movement units can be maintained—in particular automatically—independently of a relative position of the components. It can thereby be prevented that the fastening element rotates on a relative movement of the two components. That is, the workpiece or tool arranged at the fastening element then admittedly carries out a movement in space on different movements of the two components, but no rotation about itself; it rather maintains its alignment with respect to the directions of movement of the movement units or to the environment.

For this purpose, the rotational device can include a transfer device with which a change of an angular position of the first guide arm relative to the first component or of the second guide arm relative to the second component can be transferred to the fastening element, with the transfer device in particular including a toothed belt which cooperates with a toothed wheel rotationally fixedly connected to or fixable to the first or the second component and with a toothed wheel rotationally fixedly connected or fixable to the fastening device. The belt thus compensates a pivoting of the corresponding guide arm which would result in a rotation of the fastening element relative to its environment with a fixed angular relationship between the fastening element and the guide arm. A separate transfer device is in particular associated with each guide arm to increase the dynamic stiffness of the overall arrangement.

To resolve situations in which the guide arms are aligned at 180° with respect to one another (superposition), a superposition unit is provided by which influence can be taken, on a movement of at least one of the components, on the configuration of the guide arms thereby produced. It is not always ensured solely by a movement of the movement unit in such situations that the guide arms are brought into a desired configuration, i.e. into a specific relative position. The superposition unit allows a direct or indirect influencing of the guide arms to ensure that a desired movement of the guide arms—and thus of the fastening element—is effected.

For example, the superposition unit is designed such that a relative movement between at least one of the components of the movement units—in particular both components—and the fastening element can selectively be generated. The relative movement is in particular a relative rotation of the fastening element. The superposition element can, for example, include a toothed belt which cooperates with a toothed wheel which can be driven to make a rotational movement and which is arranged at the first component or at the second component and with a toothed wheel associated with the fastening element. A respective toothed belt is in particular associated with both components.

A force is exerted onto the fastening element by a rotation of the toothed wheels and, for example, urges said fastening element toward or away from the base. The superposition can thus be resolved in a controllable manner. As a rule, even small rotational amounts are sufficient to apply the required force. With a symmetrical arrangement of the superposition unit, i.e. when the fastening element is in direct connection with both components via a respective belt, the desired superposition force resolving the superposition can be effected in an efficient manner by opposing rotation of the toothed wheels associated with the components.

It can easily be seen that the above-explained design of the superposition unit can also take over the compensating function of the rotational device. For this purpose, only the toothed wheels arranged at the components have to be rotationally fixedly fixable. This is made possible, for example, by a suitable design of the units driving the toothed wheels. In addition or alternatively, suitable locking means can be provided. The superposition unit and the rotational device can also be separate assemblies.

In accordance with a further embodiment of the superposition unit, it is designed such that a coupling can selectively be established between at least one of the guide arms and the fastening element. This coupling is preferably a magnetic coupling. The superposition unit, for example, includes a coil by which, on application of a current, a magnetic field can be generated which cooperates with a magnet. The coil is preferably arranged at the fastening element, whereas the magnet is associated with one of the guide arms.

Provision can be made that the coil and the magnet are arranged at the fastening element or at one of the guide arms such that they adopt a minimal spacing on a straight-line arrangement of the guide arms. In other words, the coil and the magnet should be positioned such that they are located as close to one another as possible in the superposition to achieve an efficient coupling of the named components. Since the guide arms and the fastening element are arranged differently relatively to one another in the possible superpositions, at least one magnet/coil pair can be provided for each superposition. It is understood that on a use of other coupling mechanisms they can likewise be designed such that all superpositions can be influenced.

To increase the stability of the manipulation apparatus, a coupling element can be provided which establishes a further coupling between the first component and the second component in addition to a coupling via the pivotal connections and the fastening element. In other words, an additional coupling path is provided which connects the first and second components and which does not include the fastening element and/or the pivotal connections. The two components are directly coupled to one another by the coupling element for mutual stabilization. With a suitable design of the coupling element, it is prevented, for example, that the two components are urged apart or together by forces acting transversely to the direction of movement, which is in particular problematic when the two components are in a "moved out" state, i.e. when the fastening element is comparatively far away from the movement units.

In accordance with an embodiment, the coupling element is movably arranged at the first component and at the second component. The coupling element is in particular movable in parallel with the directions of movement and/or longitudinal extents of the components. The coupling element can thus be displaced along the components in order to ensure, for example, that they maintain a substantially constant spacing.

The coupling element can include a toothed wheel which meshes with a toothed arrangement arranged at the first component and with a toothed arrangement arranged at the second component. The toothed arrangements are in particular arranged in the region of the pivot joints at the component side. On a suitable design of the components, the interplay of the toothed wheel with the toothed arrangement results in the coupling element always being in a desired region—i.e. in the region of the toothed arrangements—where the largest transverse loads act on the components. In other words, it is ensured in a simple manner by the described mechanism that the coupling element is always in the desired position to contribute efficiently to the stability of the manipulation apparatus. What is ultimately important is that the coupling element does not "migrate" during the operation of the manipulation apparatus out of the region in which the largest loads occur and in which the coupling element consequently also achieves the greatest advantages. It should simultaneously be ensured that the coupling element has no disadvantage influence on the dynamics of the manipulation apparatus.

In accordance with an advantageous embodiment, the first and second movement units are arranged in a plane which is arranged substantially horizontal in the position of use of the manipulation apparatus. It is, however, understood that generally any desired orientations of the plane can be imagined such as a vertical or an oblique arrangement of the plane in space.

The movement units can be arranged movable at a common base, with a travel device of the movement units extending—with respect to a position of use of the manipulation apparatus—in particular perpendicular to the linear movements of the first and second components which can be generated by the movement units. Such a design of the manipulation apparatus allows a triaxial manipulation of workpieces and therefore increases its usage possibilities. It is also possible to arrange the movement units movably at separate base units. The movement units can be mechanically coupled to one another to guarantee a synchronous travel. If a separate mechanism for vertical travel is associated with each of the movement units, a synchronization can additionally or alternatively be effected by a control unit.

The movement units are preferably linear motors. No converter mechanisms are therefore required which convert the rotational movements provided by the conventionally used motors into the linear movements of the first and second components.

The sum of the lengths of the first and second pivotal connections, in particular the sum of the lengths of the two guide arms can be larger than a spacing between the directions of movement of the movement units. In other words, the pivotal connections are longer taken together in their maximum longitudinal extents than a spacing between the two directions of movement of the movement unit. It is admittedly not absolutely necessary that the maximum lengths of the two pivotal connections are of equal length; however, this proves to be advantageous in many cases.

The invention further relates to a method of operating a manipulation apparatus for handling and/or processing a workpiece which includes a movement unit for generating a linear movement of a first component and a second movement unit for generating a linear movement of a second component. The first component is connected via a first guide arm and the second component is connected via a second guide arm to a fastening element which is suitable for taking up the workpiece and/or a tool. The two guide arms are directly or indirectly pivotably connected to one another via at least one pivot joint.

The method provides that the first component and the second component are moved synchronously and by an equal amount in parallel in one direction to generate a linear translational movement of the fastening element. To generate a movement of the fastening element which includes a pivot movement and which can also include an additional linear translational movement component, the first component and the second component are moved in opposite directions and/or by a different amount.

In other words, a pure linear translational movement is generated by a synchronous movement of the components in the same direction, whereas a movement of the fastening element which includes a pivot component and/or which effects a lateral offset of the fastening element generates different movements of the components—in opposition directions and/or of unequal amounts and/or of unequal speeds. An advantage of this method thus comprises, among other things, that the fastening element can be moved in one plane by the two movement units acting in parallel. This allows the use of manipulation apparatus which are of a simple design construction and which can be manufactured and maintained inexpensively.

Further embodiments of the invention are described in the description, in the dependent claims and in the drawings.

Figure 2:
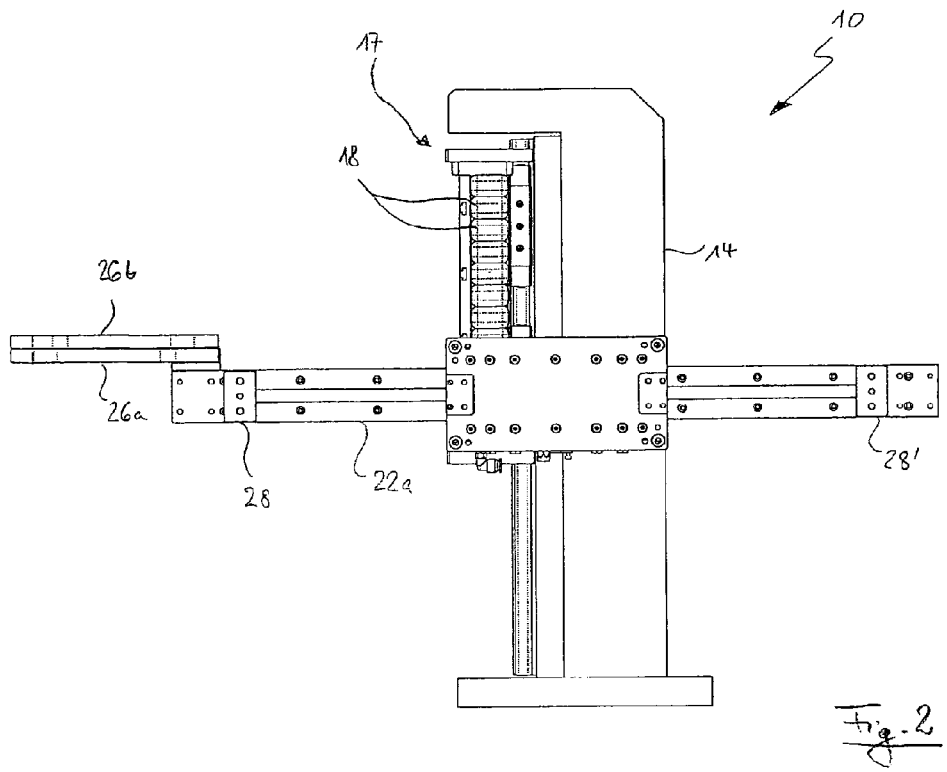
Figure 3:
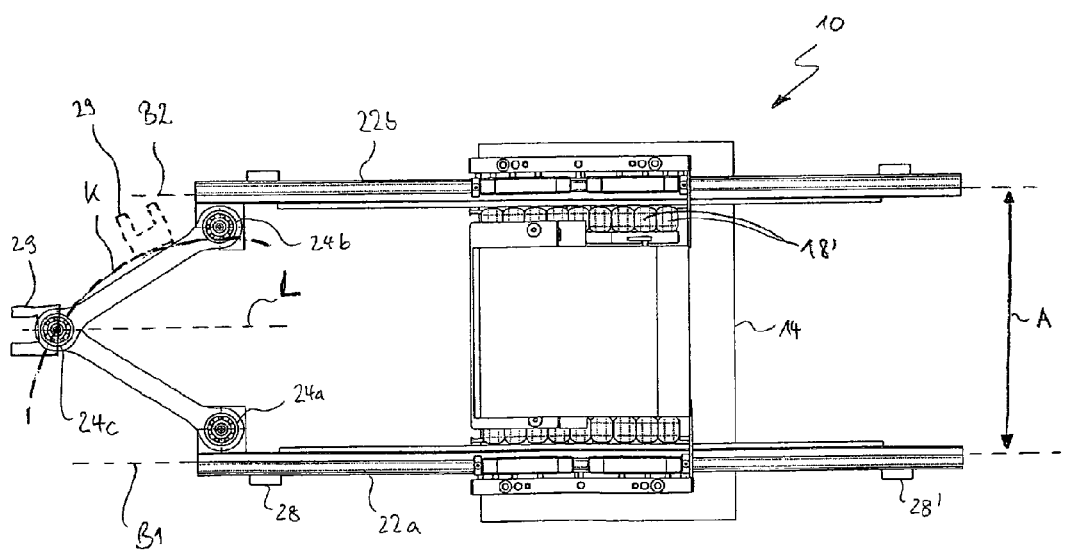
Figure 4:
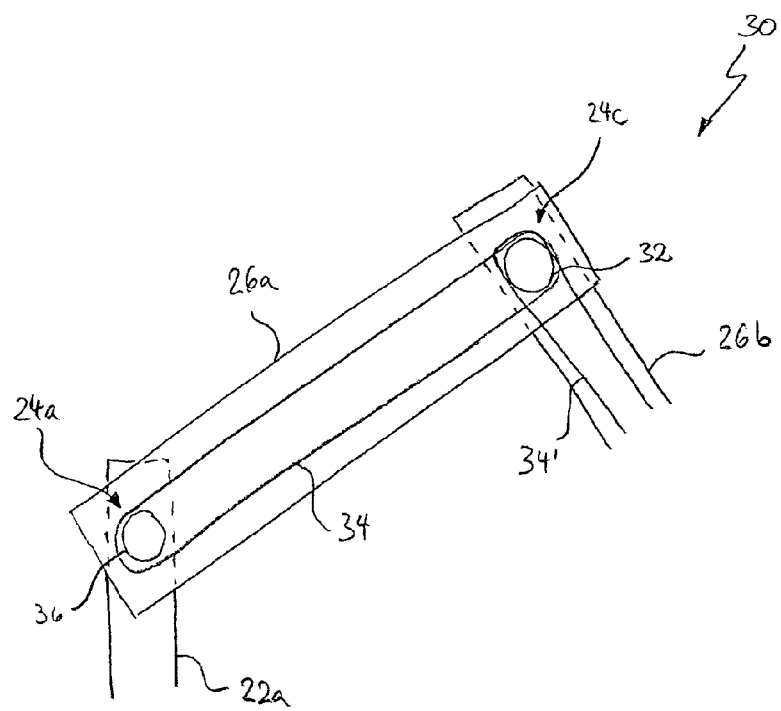
Figure 5:
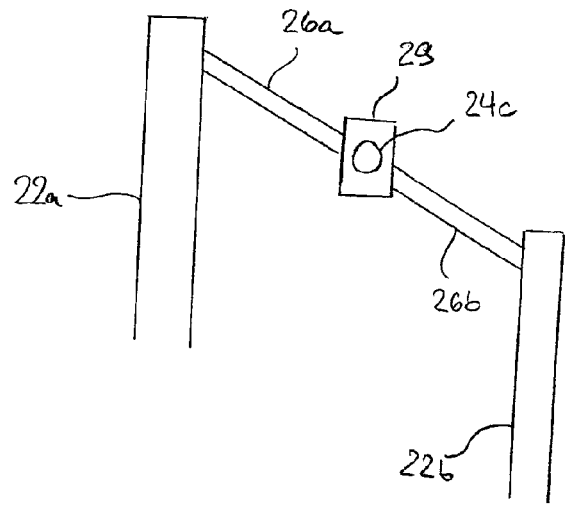
Figure 6A:
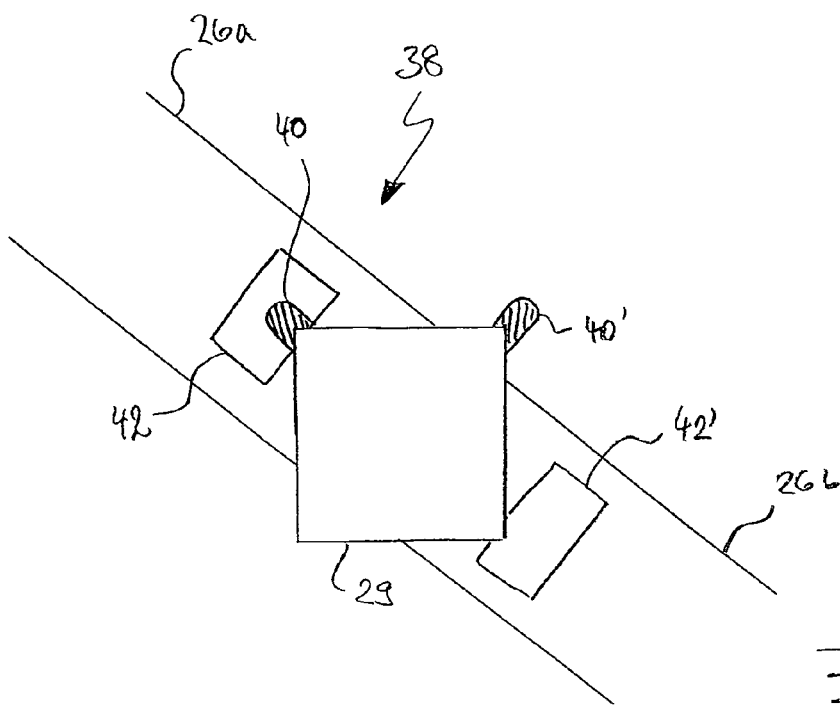
Figure 6B:
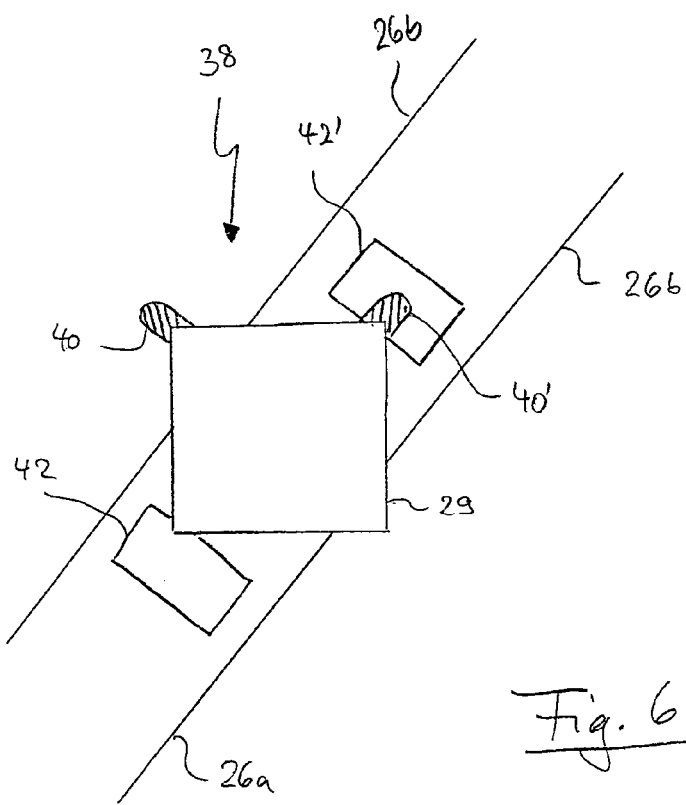

The invention will be described in the following purely by way of example with reference to advantageous embodiments and to the enclosed drawings. There are shown:

FIG. 1 an embodiment of the manipulation apparatus in accordance with the invention in a perspective view;

FIGS. 2 and 3 the embodiment shown in FIG. 1 in a lateral view and a plan view respectively;

FIG. 4 an outline sketch of an embodiment of the transfer device;

FIG. 5 a schematic representation of a superposition of the guide arms;

FIGS. 6a and 6b outline sketches of a superposition unit in different superpositions;

FIGS. 7 to 11 different view of a further embodiment of the manipulation apparatus in accordance with the invention; and FIGS. 12 to 14 sectional views of the pivotal connections of the embodiment of FIGS. 7 to 11.

FIG. 1 shows a manipulation apparatus 10 having two linear motors 12a, 12b which are arranged symmetrically laterally at a base 14. The linear motors 12a, 12b are arranged at the base 14 in a travelable manner in the vertical direction by means of a linear motor 16. The linear motor 16 includes coils 18 arranged at a carriage 17 carrying and mutually coupling the linear motors 12a, 12b and permanent magnets (not visible) attached to the base. The coils 18 have a current selectively applied by a control device, not shown, to move the linear motors 12a, 12b vertically by a cooperation with the permanent magnets 20.

The linear motors 12a, 12b each have a runner 22a or 22b respectively which can each be driven by a coil/permanent magnet arrangement comparable to that of the linear motor 16 to make linear movements in a horizontal plane. The coils 18' of the linear motors 12a, 12b are associated with the carriage 17, whereas the permanent magnetics are attached to the runner 22a, 22b.

The runners 22a, 22b of the linear motors 12a, 12b are connected at their left end in FIG. 1 via pivot joints 24a and 24b to guide arms 26a and 26b respectively. The guide arms 26a, 26b are in turn coupled to one another at their end remote from the respective runner 22a or 22b via a pivot joint 24c. A fastening element (not shown) can be arranged at the pivot joint 24c or at one of the guide arms 26a, 26b and can be provided for taking up a workpiece to be moved and/or a tool for processing a workpiece.

To effect a movement of the fastening element in a plane spanned by the runners 22a, 22b, the linear motors 12a, 12b are controlled by a control device, not shown. If both runners 22a, 22b are moved synchronously by the same amount in the same direction, a movement of the fastening element is generated which extends in parallel to the longitudinal axes of the runners 22a, 22b. On a different control of the linear motors 12a, 12b, a movement of the fastening element is generated which includes a pivot movement component—optionally in addition to a pure linear component of a translational movement. If, for example, the linear motor 22a is not moved, whereas the runner 22b of the linear motor 12b is moved, the fastening element executes a circular movement about the pivot joint 24a, with the radius of the circular movement corresponding to the length of the guide arm 26a. If, in contrast to this, both runners 22a, 22b move in the same direction, but by a different amount, a movement results which is the sum of a translational movement and of a circular movement, with the exact movement depending on the amount and on the speed of the movements of the two runners 22a, 22b. Such a combined movement path of the fastening element is likewise generated by an opposite movement of the runners 22a, 22b—i.e. in the case of a movement of the runners 22a, 22b in opposite directions.

Differently than shown in FIG. 1, the guide arms 26a, 26b can also be designed with different lengths to take special demands into account. It is furthermore understood that the base 14 can be rotatably supported about a vertical or horizontal axis if required to be able to provide additional freedoms to generate a movement of the fastening element and to increase the range of action of the manipulation apparatus 10.

Instead of the base 14, two base units can also be provided which each support one of the linear motors 12a, 12b separately from one another.

In the manipulation apparatus 10, the vertical movability of the linear motors 12a, 12b results from the length of the linear motor 16, whereas the points which can be reached in the horizontal plane are defined by the length of the runners 22a, 22b and the design of the guide arms 26a, 26b. Differing from the embodiment of the manipulation apparatus 10 shown in FIG. 1, the guide arms 26a, 26b can extend toward the base 14, starting from the pivot joints 24a, 24b, to form an inwardly directed V. It is also possible to configure the manipulation apparatus 10 such that is it possible to switch between a configuration of the guide arms 26a, 26b shown in FIG. 1 which form an outwardly directed V and a configuration with an inwardly directed V. It is advantageous for this purpose to provide a device which ensures on a transition between the two configurations in which the guide arms 26a, 26b form a straight line on which the pivot joints 24a, 24b, 24c lie (superposition) that the desired configuration is actually adopted and a "folding back" into the starting configuration does not take place. Different embodiments of such a device will be described in more detail in the following.

FIG. 2 shows the manipulation apparatus 10 in a side view, whereby the coils 18 of the linear motor 16 can be clearly recognized. In addition, abutments 28, 28' can be seen at the runner 22a which limit a maximum movement of the runner 22a.

FIG. 3 shows a plan view of the manipulation apparatus 10 with reference to which the geometrical relationships again become clear on a movement of the runners 22a, 22b. It is understood that a synchronous movement of the runners 22a. 22b along their respective direction of movement B1, B2, which are arranged offset in parallel by a spacing A, results in a movement of the pivot joint 24c along a line L. If only the runner 22b is moved, the pivot joint 24c, and thus the fastening element fastened in this region—for example a gripper 29—is moved onto a circular path K. A movement of both runners 22a, 22b effects a mixed form of the above-described extreme examples.

It can be seen from the above observations that the gripper 29 is pivoted on a movement on the circular path K or on an above-described mixed form of movement, if it is rigidly fastened to the pivot joint 24c. This situation is symbolized in FIG. 3 by a dashed-line representation of the gripper 29. That is, an alignment of the gripper 29 with respect to the environment (for example, the base 14) was changed. This can admittedly be desired in certain cases; however, it proves advantageous if this rotation is compensated by a suitable mechanism so that the alignment of the gripper 29 with respect to the base 14 is not changed.

FIG. 4 shows a compensation mechanism 30 which ensures this. The pivot joint 24c (not shown in detail) is in this respect designed so that, on the one hand, the two guide arms 26a, 26b are coupled to one another in a manner pivotable relative to one another, but that, on the other hand, a rotation of a fastening element (not shown in detail) relative to the two guide arms 26a, 26b is also possible. A toothed wheel 32 is associated with the fastening element and is rotationally fixedly connected to it and is coupled to a toothed wheel 36 via a toothed belt 34—preferably a steel belt—with said toothed wheel being arranged rotationally fixedly at the runner 22a and coaxial to the pivot joint 24a (not shown in detail). If a pivoting of the guide arm 26a is generated by a relative movement of the two runners 22a, 22b, this results in a movement of the belt 34 which in turn causes a corresponding rotation of the toothed wheel 32 and thus of the fastening element connected to it. Since the two toothed wheels 32, 36 have the same radius, the pivoting of the guide arm 26a is transferred to the same extent to the fastening element. The alignment of the fastening element after the pivoting of the guide arm 26a therefore corresponds to the alignment before the pivoting of the guide arm 26a, although a displacement of the fastening element in the plane of the drawing has taken place.

It is generally sufficient that the compensation mechanism 30 has the above-described components to satisfy its function. It is, however, also preferred for stability reasons that—as shown by indication in FIG. 4—a second belt 34' is provided which couples the toothed wheel 32 to a toothed wheel, not shown, of the guide arm 26b.

An actively operable pivot mechanism can be associated with the fastening element and allows a change of the alignment of the fastening element as required. It can be provided in addition to the compensation mechanism 30 so that an automatic compensation of the pivot movement of the guide arms 26a, 26b always takes place and additionally—for example on the taking up or processing of a workpiece—a controlled rotation of the fastening mechanism is possible. The pivot mechanism can also replace the compensation mechanism 30. The above-named compensation is then provided by a suitable control of the pivot mechanism with the aid of a control device.

FIG. 5 shows a variant of the superposition already mentioned above in which the two guide arms 26a, 26b are arranged in a line, i.e. are arranged at an angle of 180° toward one another. It is understood that a similar superposition is present when the runner 22a is in a position which corresponds to that of the runner 22b in FIG. 5, and vice versa. For the controlled resolution of this position, a superposition unit can be provided which acts on at least one of the guide arms 26a, 26b or on the gripper 29 to generate a force by which the guide arms 26a, 26b are forced into the desired configuration on a movement of the runners 22a, 22b. An embodiment of such a superposition unit is shown in FIGS. 6a and 6b.

FIG. 6a shows a superposition unit 38. It includes two coils 40, 40' which are arranged at the gripper 29. In a first superposition, the coil 40 is located above a magnet 42 which is arranged at the guide arm 26a.

When current is applied to the coil 40, a coupling is established between it and the magnet 42 which ultimately effects a certain coupling between the gripper 29 and the guide arm 26a. It is possible to influence by this coupling which configuration the two guide arms 26a, 26b adopt when at least one of the two guide arms 26a, 26b is moved. If, for example, the runner 22b connected to the guide arm 26b moves upwardly, it is ensured by the above-described coupling that a V-shaped configuration of the guide arms 26a, 26b is adopted. In other words, the coupling of the guide arm 26a with the gripper 29 damps or prevents a relative movement between these two components, whereas a pivotability between the guide arm 26b and the gripper 29 is not impaired.

A comparatively weak coupling between the coil 40 and the magnet 42 is as a rule already sufficient to influence the pivotability between the corresponding guide arm 26a, 26b and the gripper 29 so that the desired effect occurs.

If only the coil 40 were provided, the second possible superposition shown in FIG. 6b could not be selectively resolved since no coupling can be established between the gripper 29 and one of the guide arms 26a, 26b. The coil 40' is therefore additionally provided at the gripper 29. In the superposition shown in FIG. 6b, the coil 40' is located above a magnet 42' which is arranged at the guide arm 26b. This superposition can also be resolved in a controlled manner by a suitable current application to the coil 40'.

In addition to the coils 40, 40' shown, coils can likewise be provided at the lower corners of the gripper 29. If current is applied to respective obliquely opposite coils with different polarity, a coupling is generated, on the one hand, and a repulsion between the coils and the respective magnets, on the other hand, whereby an even better control of the resolution of the superposition is made possible and/or a lower current application to the coils is required to achieve the desired effect.

It is generally also possible to associate the coils 40, 40' with the guide arms 26a, 26b and to arrange the corresponding magnets 42, 42' at the gripper 29. However, the arrangement of the coils 40, 40' at the gripper 29 is preferred since it does not rotate during the movements of the runners 22a, 22b—provided a compensation mechanism 30 or an apparatus of the same effect is provided—which facilitates the power supply for the coils 40, 40'.

The above-described operation of the superposition unit 38 can also be achieved in that the compensation mechanism 30 shown in FIG. 4 is slightly modified. For this purpose, the toothed wheel 36 is not rotationally fixedly fastened to the runner 22a, but can rather, for example, be actively rotated in a controlled manner by an electric motor. A force can thereby be exerted on the gripper 29 which is of the same effect as the above-described coupling of the gripper 29 with the guide arms 26a, 26b. It is preferred in this case if the modified compensation mechanism 30 has a symmetrical structure and if both toothed wheels 36 associated with the runners 22a, 22b are actively rotatable. An efficient resolution of the superpositions can be achieved by an opposite rotation of the toothed wheels 36.

FIG. 7 shows a further embodiment 10' of the manipulation apparatus. Like the manipulation apparatus 10, it has two linear motors 12a, 12b which are arranged symmetrically. No details of a vertical movability of the linear motors 12a, 12b are shown in FIG. 7. It is, however, generally possible to provide such a movability and/or a rotatable base with which the motors 12a, 12b are in direct or indirect connection. The manipulation apparatus 10' can—like the manipulation apparatus 10-be oriented in any desired manner in space.

The runners 22a, 22b of the motors 12a, 12b of the manipulation apparatus 10' in principle have the same structure as that of the manipulation apparatus 10.

The decisive difference between the manipulation apparatus 10 and 10' lies in the design of the coupling between the runners 22a, 22b with whose aid a movement of a workpiece or of a tool in a plane spanned by the runners 22a, 22b can be generated. Beside the guide arms 26a, 26b, additional guide arms 26a', 26b' are provided in the manipulation apparatus 10' by which an increased stability and in particular different movement dynamics are achieved. In addition, the guide arms 26a, 26b are not directly coupled to one another by a common pivot joint 24c, as is the case in the manipulation apparatus 10, but the guide arms 26a, 26b of the manipulation apparatus 10' are rather coupled via separate pivot joints 24c' to a base plate 29a' of a fastening device 29'. The fastening device 29' furthermore includes a work plate 29b' which is fixedly connected to the base plate 29a'.

The guide arms 26a', 26b' are coupled via pivot joints 24a' and 24b' to the runners 22a and 22b respectively, on the one hand. On the side of the fastening device 29', a link of the guide arms 26a' and 26b' via separate pivot joints 24c'' takes place which will be described even more exactly with reference to the following Figures.

The work plate 29b' defines a frontal plane which is aligned perpendicular to the longitudinal extent of the runners 22a, 22b. At its front side, that is at the side of the work plate 29b' remote from the motors 12a, 12b, a workpiece, a gripper and/or a tools for processing workpieces can be fastened, for example. The base plate 29a' ensures that the two pivot joints 24c' and the two pivot joints 24c" are in a fixed spatial ratio with respect to one another. Since the guide arms 26a, 26b, 26a', 26b' are all of equal length, they span a parallelogram in the predefined pivot joint arrangement which ensures that the frontal plane of the work plate 29b' is not rotated by a movement of the runners 22a, 22b. In other words, the frontal plane is admittedly displaced, but not pivoted, within a plane spanned by the runners 22a, 22b. The provision of the additional guide arms 26a', 26b' not only results in advantageous dynamics of the manipulation apparatus 10' for many applications, but rather also increases its stability.

In the state shown in FIG. 7, the runners 22a, 22b of the linear motors 12a, 12b are in different positions. The runner 22b is "moved out" further in comparison with the runner 22a so that the fastening apparatus 29' was offset to the left viewed from the motors 12a, 12b. In other words, a different movement of the runners 22a, 22b results in a lateral offset of the fastening device 29'. It is understood that the amount of the offset is inter alia a function of a spacing A of the runners 22a, 22b and of the length of the guide arms 26a, 26b, 26a', 26b'. The movement clearance of the manipulation apparatus 10' can be increased by an increase in the spacing A between the runners 22a, 22b and/or by an extension of the guide arms 26a, 26b, 26a', 26b'.

Figure 8:
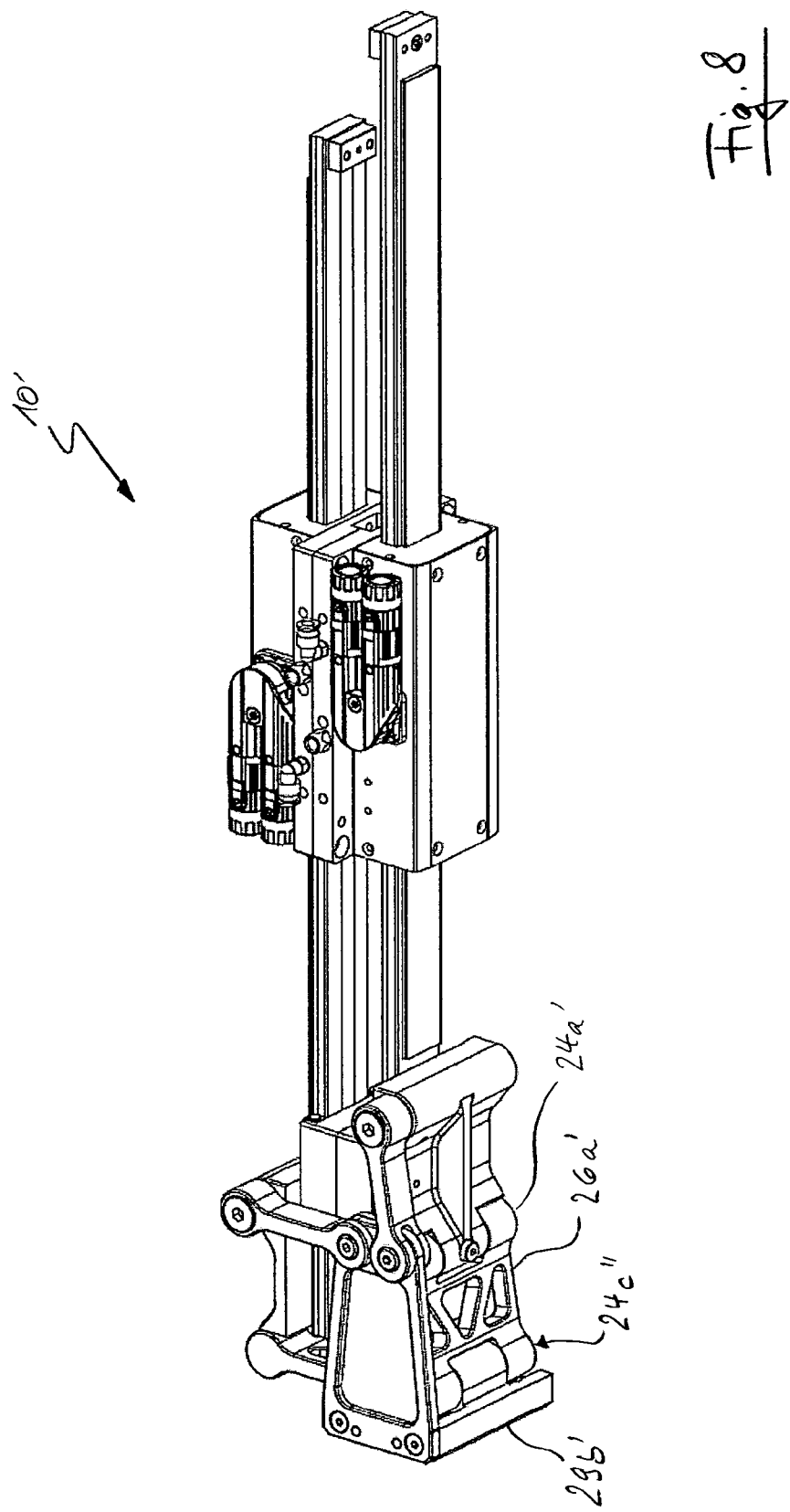

FIG. 8 shows a further view of the manipulation apparatus 10' from a different angle of view. The pivot joint 24c" by which the guide arm 26a' is coupled to the work plate 29b' can thereby be recognized better.

Figure 9:
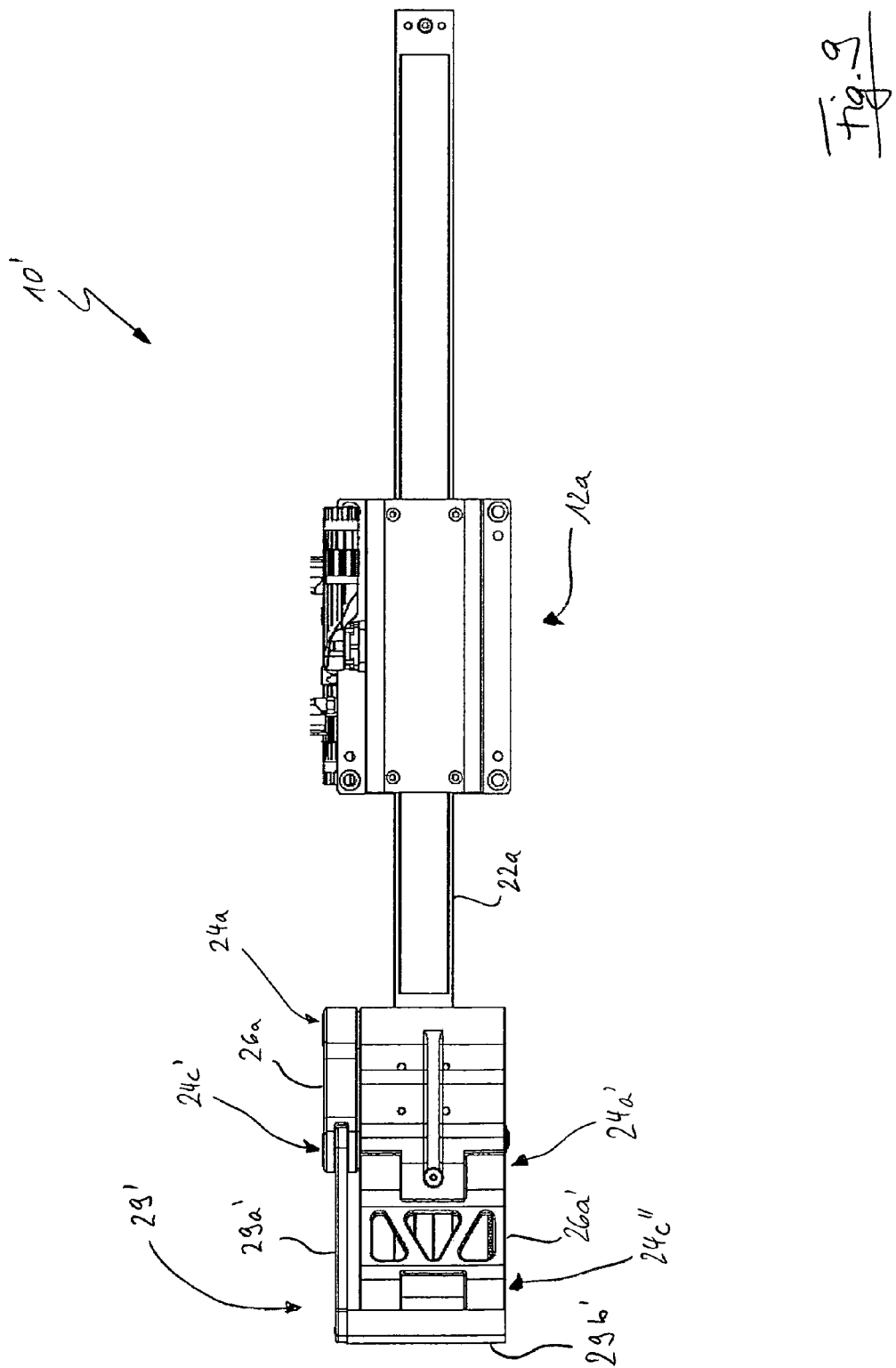

FIG. 9 shows a side view of the manipulation apparatus 10', whereby it can be clearly recognized that a vertical extent of the guide arms 26a, 26b is substantially smaller than that of the guide arms 26a', 26b' (guide arm 26b' cannot be seen in FIG. 9, but is substantially the same as the guide arm 26a'). The guide arms 26a', 26b' are designed so that they are able to carry the main load of an article or tool connected to the work plate 29b'. The comparatively thin base plate 29a', like the guide arms 26a, 26b, hardly carries any loads. These components mainly serve for the fixing of the dynamics of the fastening device 29'.

Figure 10:
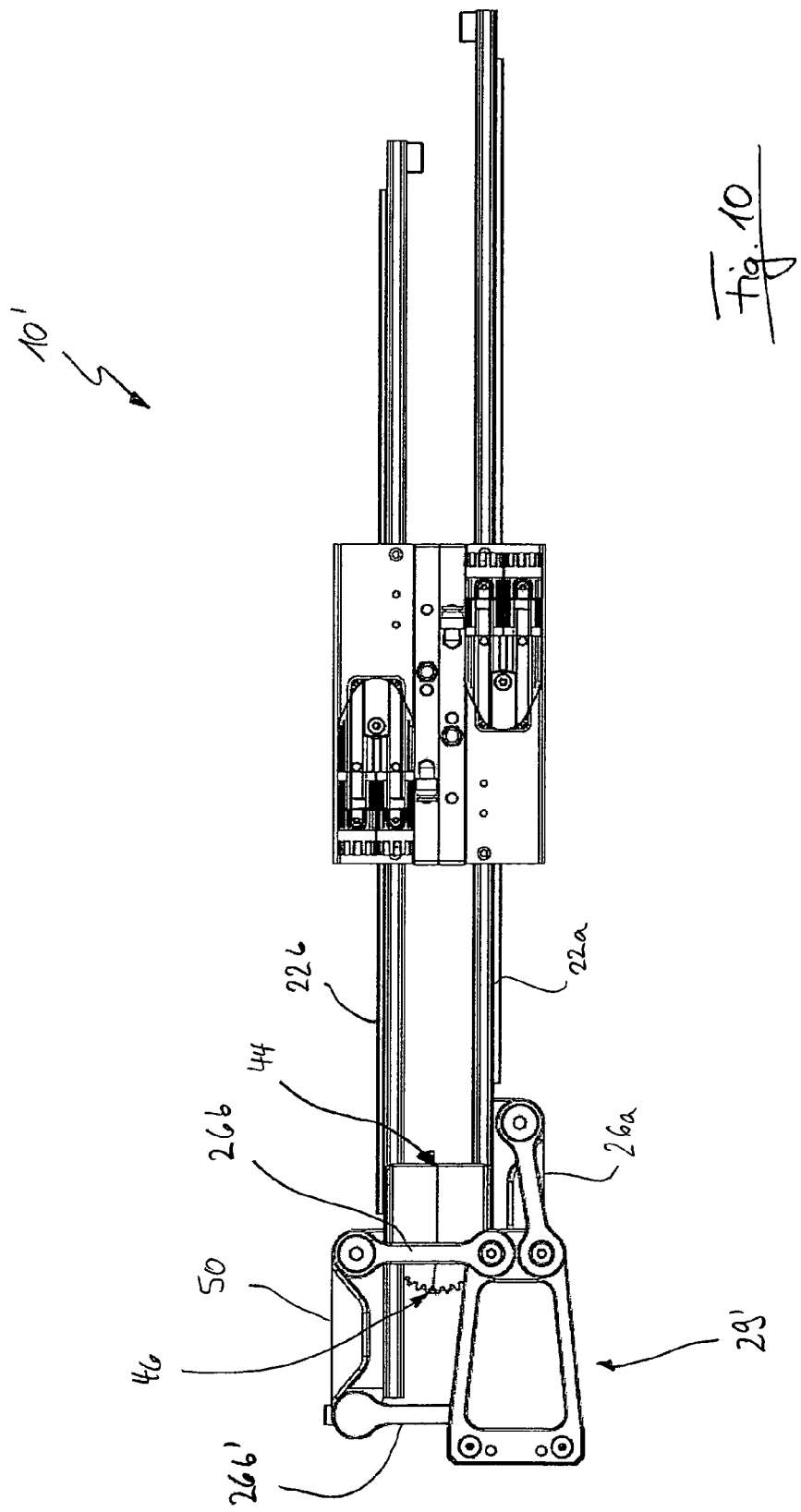

FIG. 10 shows a plan view of the manipulation apparatus 10'. It can be seen from it that the guide arms 26b, 26b' are pivotably fastened to a base body 50 which is in turn fixedly connected to the runner 22b. The same applies analogously to the guide arms 26a, 26a'. It is generally also possible to provide devices at the runners 2a, 22b by which the guide arms 26a, 26b, 26a', 26b' can be directly pivotably fastened to the runners 22a, 22b.

FIG. 10 furthermore shows that the runners 22a, 22b are not only connected to one another via the guide arms 26a, 26b, 26a', 26b' and the fastening device 29'. Beside this indirect coupling, a direct coupling of the runners 22a, 22b is provided to increase the stability of the manipulation apparatus 10' and in particular to prevent the runners 22a, 22b from being urged apart on operation of the manipulation apparatus 10'. For this purpose, a coupling carriage 44 is provided which is movably arranged both at the runner 22a and at the runner 22b. In other words, the coupling carriage 44 can admittedly be moved along the runners 22a, 22b, but it rather couples the runners 22a, 22b in a direction transverse to their direction of movement to ensure that they cannot be urged together or apart. This coupling is in particular of importance in the front region of the runners 22a, 22b since forces occur in this region on operation of the manipulation apparatus 10' which are ultimately generated by the indirect coupling and the load by the workpiece or tool. These forces can in particular generate substantial bending moments, which act on the runners 22a, 22b, in a "moved out" state of the runners 22a, 22b. To prevent the coupling carriage 44 from leaving the above-described region during the operation, a mechanism is provided which has a toothed wheel 46 arranged at the carriage 44 and whose function will be described in more detail with reference to FIG. 11.

Figure 11:
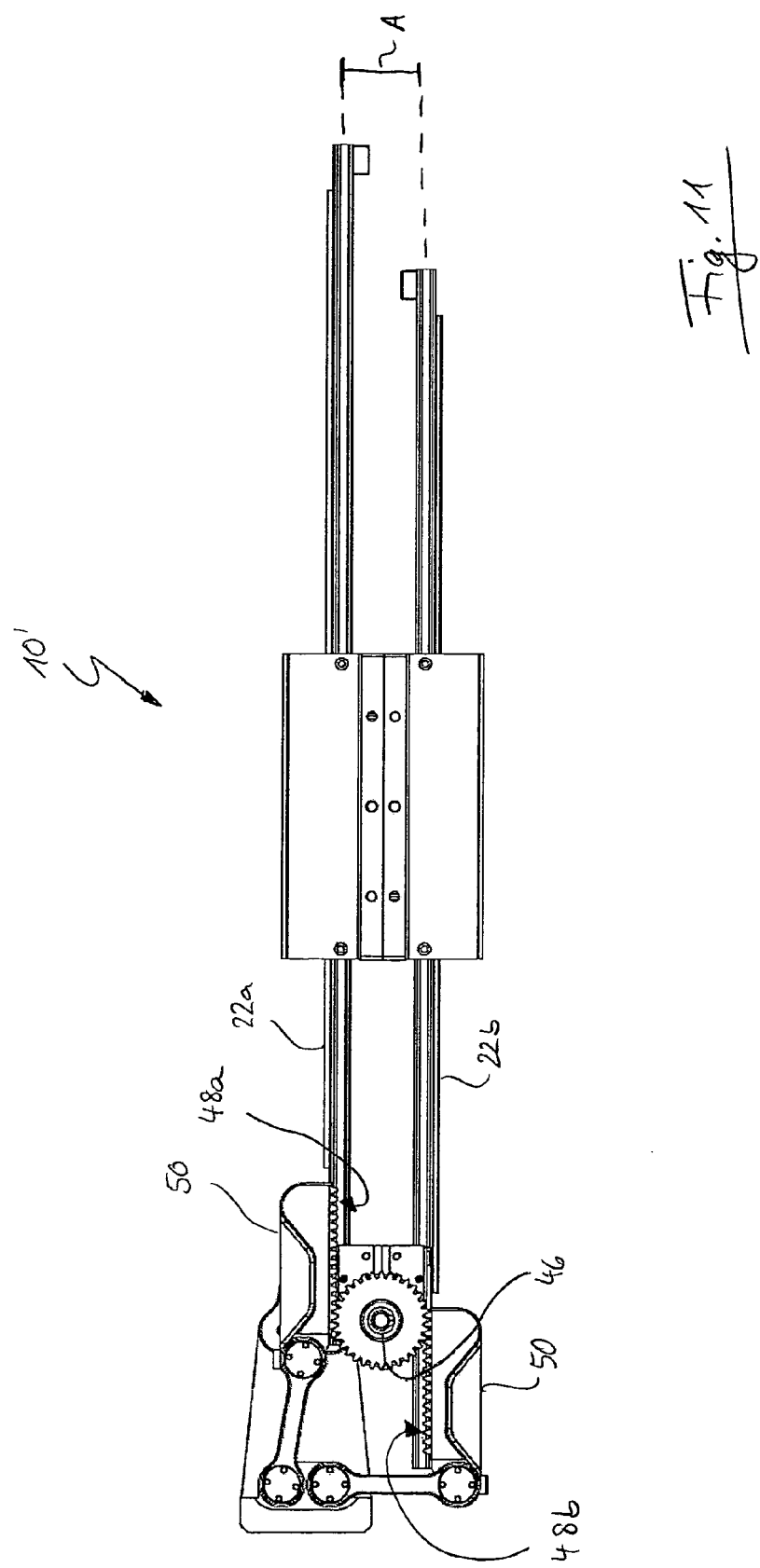

FIG. 11 shows a view of the manipulation apparatus 10' from below. The above-mentioned toothed wheel 46 meshes with toothed arrangements 48a, 48b which are arranged at the base bodies 50. The coupling carriage 44 is always held by the cooperation of the movements of the runners 22a, 22b and by the coupling by means of the toothed wheel 46 and of the toothed arrangements 48a, 48b in a region which is approximately bounded by the pivot joints 24a, 24a', 24b, 24b'. That is, the coupling carriage 44 always stabilizes the runners 22a, 22b where the largest bending moments and transverse moments are to be expected in that it keeps the spacing A substantially constant between the runners 22a, 22b. It is understood that the operating principle of the coupling carriage 44 can generally also be transferred to the manipulation apparatus 10.

The design of the indirect coupling of the runners 22a, 22b will be explained in more detail in the following with reference to FIGS. 12 to 14, said design determining the dynamics of the movement which can be generated by the manipulation apparatus 10'.

FIG. 12 shows a plan view of a part of the manipulation apparatus 10'. The runners 22a, 22b are in a "moved in" state so that the base bodies 50 almost contact the corresponding motors 12a, 12b. A part of the base plate 29a' has been removed to be able to show a horizontal section through the work plate 29b' and the guide arms 26a', 26b'. It can be recognized that pivot pins 52, by which the guide arms 26a', 26b' are pivotably supported at the respective base body 50 or at the work plate 29b', are rotationally fixedly secured by pins 54 at the corresponding base body 50 or at the work plate 29b'.

FIG. 12 furthermore shows that the work plate 29b' bounds a maximum pivoting of the arms 26a', 26b' by the design of its side facing the motors 12a, 12b. It is defined by abutments 55 that the arms 26a', 26b' can be pivoted by a maximum of somewhat more than 90° relative to the longitudinal extent of the runners 22a, 22b. Such a maximum pivoting is shown in FIGS. 7 to 11.

FIG. 13 shows a section through the guide arm 26b' and the work plate 29a' along a section plane AA whose position is shown in FIG. 12. It can be seen that the pivot pins 52 are rotatably supported at the guide arm 26b' by bearings 56 (in a case emphasized by a marking circle). An inverse design is generally also conceivable in which the pivot pins 52 are fixedly fixed to the guide arm 26b', while the bearings 56 are provided at the work plate 29a' or at the base body 50.

In FIG. 13, the position of a section plane BB is also set forth which corresponds to the section plane of the left part of FIG. 12.

FIG. 14 shows a section through the guide arm 26b along the section plane CC whose position can likewise be seen from FIG. 12. Since the guide arm 26b is, as already described above, hardly loaded, but mainly serves for the guidance of the fastening device 29', it is made substantially lighter than the guide arm 26b'. The support of the guide arm 26b is likewise made considerably simpler than the support of the guide arm 26b' and takes place by means of pivot spigots 58, 58' which ultimately form the pivot joints 24b and 24c' respectively.

It is understood that the statements on the guide arms 26b, 26b' apply in an analogous manner to the guide arms 26a, 26a'.

One of the advantages of the manipulation apparatus 10, 10' is that both runners 22a, 22b take up a load by the workpiece or tool arranged in the region of the guide arms 26a, 26b. With a comparable compact construction and dimensioning of the motors 12a, 12b, larger loads can therefore be moved than in conventional industrial robots. In addition, the stability of the manipulation apparatus 10, 10' is improved overall. The manipulation apparatus 10, 10' can additionally be operated efficiently due to the high dynamics of linear motors. A further advantage is that the linear motors 12a, 12b can be substantially of the same construction so that an effort for maintenance and adjustment is minimized.

The invention claimed is:

1. A manipulation apparatus for at least one of handling and processing a workpiece comprising a first movement unit for generating a linear movement of a first component and a second movement unit for generating a linear movement of a second component,
   wherein the first and second movement units are arranged relative to one another such that the movements of the first component and of the second component which can be generated by the first and second movement units are aligned in parallel with one another;
   wherein the first component is connected via a first pivotal connection and the second component is connected via a second pivotal connection to a fastening element which is suitable for taking up at least one of the workpiece and a tool;
   wherein the first pivotal connection includes a first guide arm which is coupled to the first component by means of a first pivot joint;
   wherein the second pivotal connection includes a second guide arm which is coupled to the second component by means of a second pivot joint;
   wherein the first guide arm and the second guide arm are coupled to one another directly or indirectly in a manner pivotable relative to one another by at least one pivot joint;
   wherein the first guide arm and the second guide arm are coupled to the fastening element by separate pivot joints; and
   wherein the fastening element includes a base plate and a work plate, with the first guide arm and the second guide arm being coupled to the base plate by the separate pivot joints, and with a third guide arm of the first pivotal connection and a fourth guide arm of the second pivotal connection being coupled to the work plate by separate pivot joints.

2. A manipulation apparatus in accordance with claim 1, wherein the first pivotal connection includes the third guide arm which is coupled to the first component by means of a third pivot joint; and wherein the second pivotal connection includes the fourth guide arm which is coupled to the second component by means of a fourth pivot joint.

3. A manipulation apparatus in accordance with claim 2, wherein the third guide arm and the fourth guide arm are coupled to the fastening element by separate pivot joints.

4. A manipulation apparatus in accordance with claim 2, wherein the first guide arm and the third guide arm are of equal length; and wherein the second guide arm and the fourth guide arm are of equal length.

5. A manipulation apparatus in accordance with claim 2, wherein the first, second, third, and fourth guide arms are of equal length.

6. A manipulation apparatus in accordance with claim 1, wherein the base plate and the work plate are fixedly connected to one another.

7. A manipulation apparatus in accordance with claim 1, wherein the first guide arm and the second guide arm are coupled to one another in a manner pivotable relative to one another by a common pivot joint.

8. A manipulation apparatus in accordance with claim 1, wherein the fastening element is arranged rotatable relative to the pivotal connections.

9. A manipulation apparatus in accordance with claim 8, wherein a rotation device is associated with the fastening element, with an alignment of the fastening element relative to the pivotal connections being changeable by said rotation device.

10. A manipulation apparatus in accordance with claim 8, wherein a rotation device is associated with the fastening element and is designed such that an alignment of the fastening element relative to the directions of movement of the first and second movement units can be maintained independently of a relative position of the components.

11. A manipulation apparatus in accordance with claim 10, wherein the rotational device includes a transfer device with which a change of an angular position of the first guide arm relative to the first component or of the second guide arm relative to the second component can be transferred to the fastening element.

12. A manipulation apparatus in accordance with claim 11, wherein the transfer device includes a toothed belt which cooperates with a first toothed wheel rotationally fixedly connected or fixable to the first component or to the second component and which cooperates with a second toothed wheel rotationally fixedly connected or fixable to the fastening element.

13. A manipulation apparatus in accordance with claim 11, wherein a superposition unit is provided which is designed such that a relative movement can be selectively generated between at least one of the components and the fastening element; or
   wherein the superposition unit is designed such that a coupling can selectively be established between at least one of the first and second guide arms and the fastening element.

14. A manipulation apparatus in accordance with claim 13, wherein the superposition unit includes a toothed belt which cooperates with a first toothed wheel drivable to make a rotational movement and is arranged at the first component or at the second component and which cooperates with a second toothed wheel associated with the fastening element.

15. A manipulation apparatus in accordance with claim 11, further comprising a superposition unit that is designed such that a coupling can be selectively established between one of the first and second guide arms and the fastening element.

16. A manipulation apparatus in accordance with claim 15, wherein the superposition unit includes at least one coil by which a magnetic field can be generated on application of a current which cooperates with a magnet.

17. A manipulation apparatus in accordance with claim 16, wherein the coil is arranged at the fastening element and the magnet is arranged at one of the first and second guide arms.

18. A manipulation apparatus in accordance with claim 16, wherein the coil and the magnet are arranged at one of the first and second guide arms or at the fastening element such that they adopt a minimal spacing on a straight-line arrangement of the first and second guide arms.

19. A manipulation apparatus in accordance with claim 8, wherein a rotation device is associated with the fastening element and is designed such that an alignment of the fastening element relative to the directions of movement of the first and second movement units can be maintained automatically independently of a relative position of the components.

20. A manipulation apparatus in accordance with claim 1, wherein a coupling element is provided which establishes a further coupling between the first component and the second component in addition to a coupling via the pivotal connections and the fastening element.

21. A manipulation apparatus in accordance with claim 20, wherein at least one of:
the coupling element is arranged movable at the first component and at the second component, with the coupling element being travelable, and
the coupling element is travelable in parallel with the directions of movement of the components.

22. A manipulation apparatus in accordance with claim 1, wherein the first and the second movement units are arranged in a plane which is arranged substantially horizontal in the position of use of the manipulation apparatus.

23. A manipulation apparatus in accordance with claim 1, wherein at least one of:
the first and second movement units are arranged movable at a common base or at separate base units, with a direction of movement of the first and second movement units extending relative to the linear movements of the first and second components which movement can be generated by the first and second movement units; and
a direction of movement of the first and second movement units extending, with respect to a position of use of the manipulation apparatus, perpendicular to the linear movements of the first and second components.

24. A manipulation apparatus in accordance with claim 1, wherein the first and second movement units are linear motors.

25. A manipulation apparatus in accordance with claim 1, wherein the sum of a longitudinal extent of the first pivotal connection and a longitudinal extent of the second pivotal connection is larger than a spacing between the directions of movement of the first and second movement units.

26. A method of operating a manipulation apparatus for at least one of handling and processing a workpiece which includes a first movement unit for generating a linear movement of a first component and a second movement unit for generating a linear movement of a second component, wherein the first component is connected via a first guide arm and the second component is connected via a second guide arm to a fastening element which is suitable for taking up at least one of the workpiece and a tool, wherein the first and second guide arms are pivotably coupled directly or indirectly with one another via at least one pivot joint, wherein the first guide arm and the second guide arm are coupled to the fastening element by separate pivot joints, wherein the fastening element includes a base plate and a work plate, with the first guide arm and the second guide arm being coupled to the base plate by separate pivot joints, and with a third guide arm and a fourth guide arm being coupled to the work plate by separate pivot joints, the method comprising:
moving the first component and the second component synchronously and by an equal amount in parallel in one direction to generate a linear translational movement of the fastening element; and
generating a movement of the fastening element including a pivot movement by at least one of:
moving the first component and the second component in opposite directions; and
moving the first component and the second component by a different amount.

27. A manipulation apparatus for at least one of handling and processing a workpiece comprising a first movement unit for generating a linear movement of a first component and a second movement unit for generating a linear movement of a second component,
wherein the first and second movement units are arranged relative to one another such that the movements of the first component and of the second component which can be generated by the first and second movement units are aligned in parallel with one another;
wherein the first component is connected via a first pivotal connection and the second component is connected via a second pivotal connection to a fastening element which is suitable for taking up at least one of the workpiece and a tool;
wherein the first pivotal connection includes a first guide arm which is coupled to the first component by means of a first pivot joint;
wherein the second pivotal connection includes a second guide arm which is coupled to the second component by means of a second pivot joint;
wherein the first guide arm and the second guide arm are coupled to one another directly or indirectly in a manner pivotable relative to one another by at least one pivot joint;
wherein a coupling element is provided which establishes a further coupling between the first component and the second component in addition to a coupling via the pivotal connections and the fastening element; and
wherein the coupling element includes a toothed wheel which meshes with a first toothed arrangement arranged at the first component and with a second toothed arrangement arranged at the second component.

28. A manipulation apparatus for at least one of handling and processing a workpiece comprising:
a first movement unit for generating a linear movement of a first component and a second movement unit for generating a linear movement of a second component,
wherein the first and second movement units include linear motors;
wherein the first and second movement units are arranged relative to one another such that the movements of the first component and of the second component which can be generated by the first and second movement units are aligned in parallel with one another;
wherein the first component is connected via a first pivotal connection and the second component is connected via a second pivotal connection to a fastening element which is suitable for taking up at least one of the workpiece and a tool;
wherein the first pivotal connection includes a first guide arm which is coupled to the first component by means of a first pivot joint;
wherein the second pivotal connection includes a second guide arm which is coupled to the second component by means of a second pivot joint;
wherein the first guide arm and the second guide arm are coupled to one another directly or indirectly in a manner pivotable relative to one another by at least one pivot joint;

wherein the first guide arm and the second guide arm are coupled to the fastening element by separate pivot joints;

wherein the first pivotal connection includes a third guide arm which is coupled to the first component by means of a third pivot joint; and wherein the second pivotal connection includes a fourth guide arm which is coupled to the second component by means of a fourth pivot joint; and wherein the fastening element includes a base plate and a work plate, with the first guide arm and the second guide arm being coupled to the base plate by separate pivot joints, and with the third guide arm and the fourth guide arm being coupled to the work plate by separate pivot joints.

* * * * *